(12) United States Patent
Kawanabe et al.

(10) Patent No.: US 11,789,165 B2
(45) Date of Patent: Oct. 17, 2023

(54) RADIATION IMAGING APPARATUS AND RADIATION IMAGING SYSTEM

(71) Applicant: CANON KABUSHIKI KAISHA, Tokyo (JP)

(72) Inventors: Jun Kawanabe, Saitama (JP); Masato Ofuji, Gunma (JP); Kentaro Fujiyoshi, Irvine, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 118 days.

(21) Appl. No.: 17/553,490

(22) Filed: Dec. 16, 2021

(65) Prior Publication Data

US 2022/0196857 A1 Jun. 23, 2022

(30) Foreign Application Priority Data

Dec. 23, 2020 (JP) ................. 2020-214013

(51) Int. Cl.
| | | |
|---|---|---|
| *G01T 1/17* | (2006.01) | |
| *G01T 1/20* | (2006.01) | |
| *H01L 27/146* | (2006.01) | |

(52) U.S. Cl.
CPC ............ *G01T 1/17* (2013.01); *G01T 1/20184* (2020.05); *H01L 27/14612* (2013.01); *H01L 27/14658* (2013.01)

(58) Field of Classification Search
CPC . G01T 1/17; G01T 1/20184; H01L 27/14612; H01L 27/14658; H01L 27/14663
See application file for complete search history.

(56) References Cited

U.S. PATENT DOCUMENTS

| | | | |
|---|---|---|---|
| 2007/0210258 A1* | 9/2007 | Endo ...................... | H04N 25/76 250/370.11 |
| 2012/0181439 A1 | 7/2012 | Cao | |
| 2013/0240745 A1* | 9/2013 | Roos ........................ | H04N 5/32 250/370.08 |
| 2014/0241506 A1* | 8/2014 | Iwashita ............... | H04N 5/3205 378/91 |
| 2015/0346361 A1* | 12/2015 | Watanabe ................. | G01T 1/17 250/369 |
| 2022/0334273 A1* | 10/2022 | Asai ....................... | H04N 25/44 |

* cited by examiner

*Primary Examiner* — David P Porta
*Assistant Examiner* — Casey Bryant
(74) *Attorney, Agent, or Firm* — Canon U.S.A., Inc. IP Division (57) ABSTRACT

A difference in wiring capacitance between bias lines is reduced by equalizing, for pixels A connected to a signal line from a first direction and pixels B connected to the signal line from a second direction, the numbers of the pixels A and the pixels B where the pixels A and the pixels B are each connected to the corresponding bias line.

11 Claims, 8 Drawing Sheets

RADIATION IMAGING APPARATUS AND RADIATION IMAGING SYSTEM

BACKGROUND

Field

The present disclosure relates to a radiation imaging apparatus and a radiation imaging system.

Description of the Related Art

There has been a proliferation of radiation imaging apparatuses (flat panel detectors) that are two-dimensional detectors in which a drive circuit and a readout circuit are connected to a sensor substrate with a two-dimensional matrix of pixels having photoelectric conversion elements and switch elements.

Integrated circuit (IC) chips used in a readout circuit are expensive due to high-density integration of multiple analog amplifiers, analog/digital (A/D) converters, and the like, and account for a large proportion of cost for members of an imaging apparatus.

United States Patent Application Publication No. 2012/0181439 discusses a technique for halving the size of a readout circuit, that is, the number of IC chips required by sharing a signal line between two adjacent pixels without a decrease in number of effective pixels in the sensor substrate.

SUMMARY

Various embodiments of the present disclosure provide improved techniques and mechanisms for reducing artifacts of radiation images while preventing or reducing an increase in the cost of members.

In various embodiments, a radiation imaging apparatus is provided that includes a plurality of pixels each of which has a thin-film transistor and a conversion element and is arranged in a two-dimensional matrix, and a plurality of signal lines that is connected to a plurality of the thin-film transistors arranged in a column direction. The plurality of pixels includes a first pixel arranged in a first column, a second pixel arranged in a second column adjacent to the first pixel in a row direction, a third pixel arranged in a third column adjacent to the second pixel on an opposite side adjacent to the first pixel in the row direction, and a fourth pixel arranged in a fourth column adjacent to the third pixel on an opposite side adjacent to the second pixel in the row direction. The plurality of signal lines includes at least a first signal line and a second signal line arranged adjacent to the first signal line in the row direction. The thin-film transistor of the first pixel is connected to the first signal line from a first direction out of the row direction, and the thin-film transistor of the second pixel is connected to the first signal line from a second direction opposite to the first direction. The thin-film transistor of the third pixel is connected to the second signal line from the first direction, and the thin-film transistor of the fourth pixel is connected to the second signal line from the second direction. The radiation imaging apparatus further includes a first bias line for supplying a bias voltage from a first bias source to a plurality of the conversion elements arranged in the column direction, a second bias line for supplying a bias voltage from a second bias source different from the first bias source to the plurality of conversion elements arranged in the column direction. The first bias line is connected to the conversion element of the first pixel and the conversion element of the second pixel, and the second bias line is connected to the conversion element of the third pixel and the conversion element of the fourth pixel, or the first bias line is connected to the conversion element of the first pixel and the conversion element of the fourth pixel, and the second bias line is connected to the conversion element of the third pixel and the conversion element of the second pixel.

Further features of the present disclosure will become apparent from the following description of example embodiments with reference to the attached drawings.

DESCRIPTION OF THE EMBODIMENTS

Figure 1:
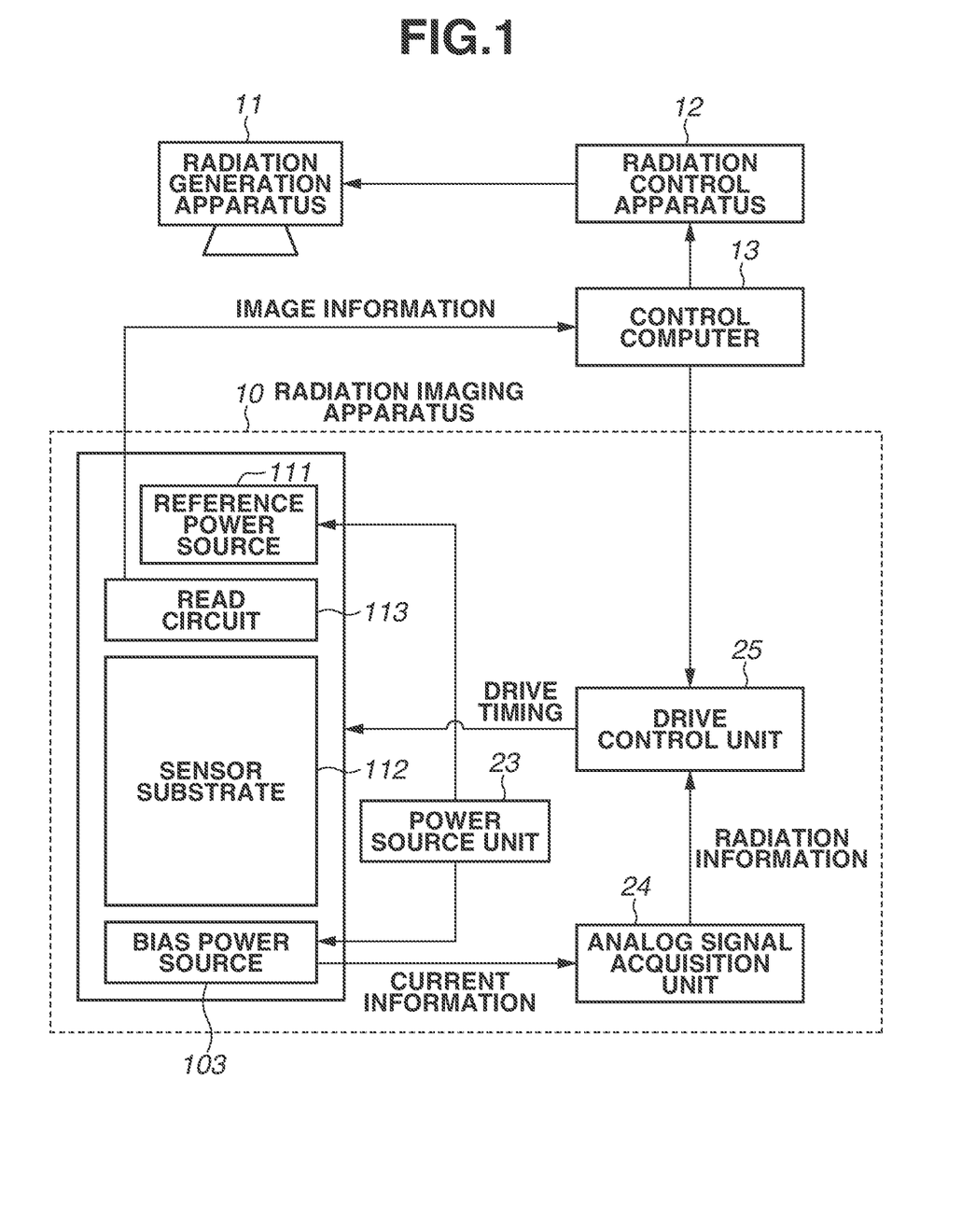
FIG. 1 is a block diagram of a radiation imaging system according to a first example embodiment.

A first example embodiment of the present disclosure will be described below. FIG. 1 is a block diagram of a radiation imaging system 500 according to the present example embodiment. The radiation imaging system 500 according to the present example embodiment includes a radiation imaging apparatus 10, a radiation generation apparatus 11, a radiation control apparatus 12, and a control computer 13.

The radiation generation apparatus 11 and the radiation control apparatus 12 applies radiation for imaging to the radiation imaging apparatus 10. The control computer 13 acquires images from the radiation imaging apparatus 10 and controls the entire radiation imaging system 500.

The radiation imaging apparatus 10 has a sensor substrate 112 that detects radiation, a readout circuit 113 that reads electric charge information from the sensor substrate 112, and a drive control unit 25 that controls driving of the sensor substrate 112. The sensor substrate 112 is provided with pixels 100 (described below in conjunction with FIG. 2), and a scintillator (not illustrated) that converts radiation into visible light is formed on the pixels 100. The visible light converted from the radiation by the scintillator is converted into an electric charge by the pixels 100.

The radiation imaging apparatus 10 also has a reference power source 111 that supplies a reference voltage to the readout circuit 113 and a bias source 103 that supplies a bias voltage to the sensor substrate 112. The radiation imaging apparatus 10 further has a power supply unit 23 that supplies electric power to the reference power source 111 and the bias source 103, and an analog signal acquisition unit 24 that acquires current information from the bias source 103.

The sensor substrate 112 of the radiation imaging apparatus 10 is a sensor in which elements for detecting radiation are arranged in a two-dimensional matrix with X columns and Y rows. The sensor substrate 112 detects radiation and outputs image information. The bias source 103 supplies a bias voltage to the sensor substrate 112 and outputs current information including temporal variation in amount of current flowing through the bias source 103.

The analog signal acquisition unit 24 calculates the current information output from the bias source 103 and outputs radiation information including temporal variation in radiation intensity. As a calculation unit, a digital signal processing circuit, such as a field programmable gate array (FPGA), a digital signal processor (DSP), or a processor is suitably used. The calculation unit may be configured with analog circuits, such as a sample-and-hold circuit and an operation amplifier. FIG. 1 illustrates the analog signal acquisition unit 24 included in the radiation imaging apparatus 10, but the analog signal acquisition unit 24 may be included in the control computer 13.

The drive control unit 25 controls the radiation imaging apparatus 10 by a driving method requested by the control computer 13. The drive control unit 25 changes the driving method of the radiation imaging apparatus 10 by using the radiation information output by the calculation unit of the analog signal acquisition unit 24.

Figure 2:
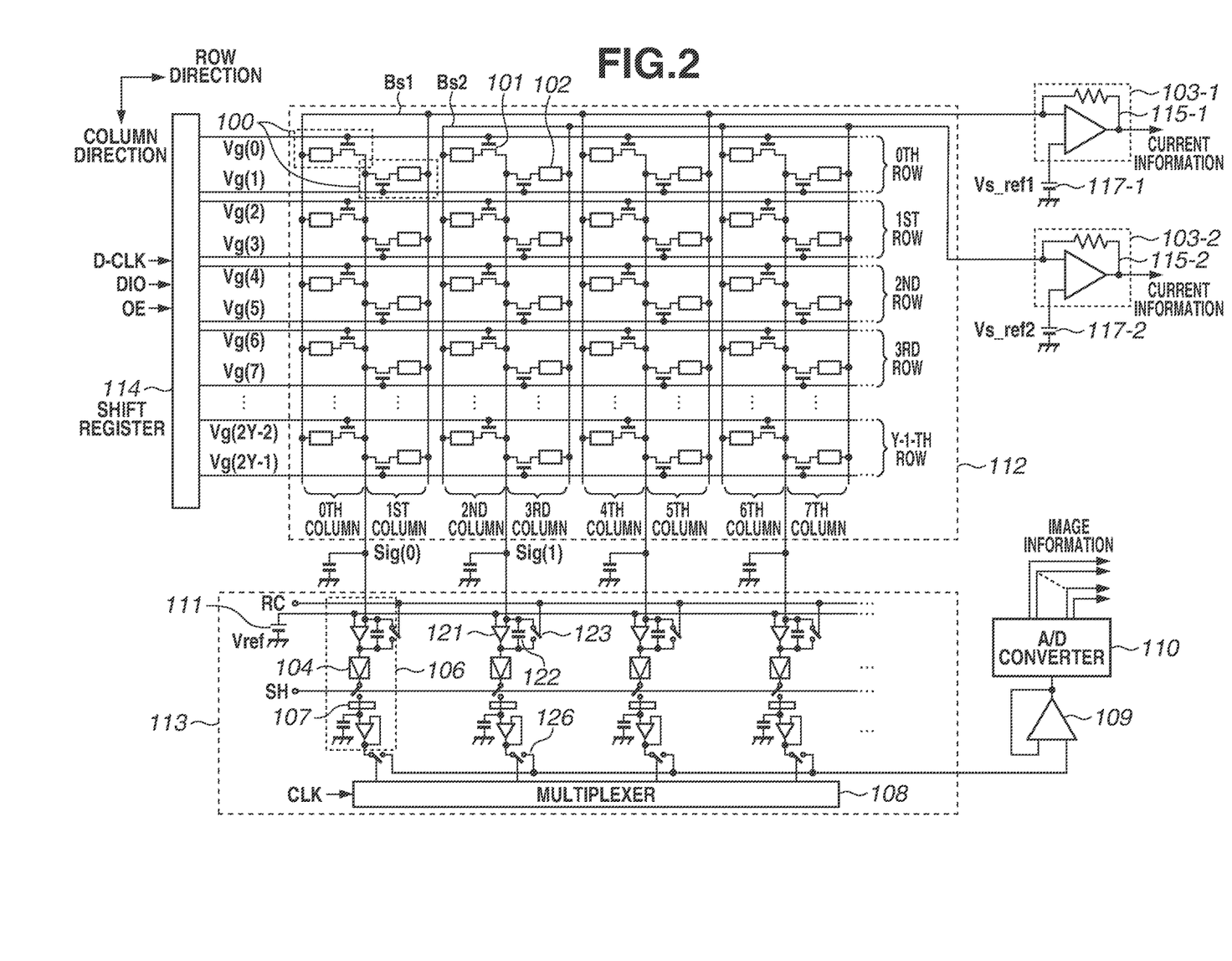
FIG. 2 is an equivalent circuit in the radiation imaging apparatus according to the first example embodiment.

FIG. 2 illustrates a portion of an equivalent circuit in the radiation imaging apparatus 10 according to the present example embodiment. The radiation imaging apparatus 10 has a drive circuit 114, the sensor substrate 112, the bias source 103, the readout circuit 113, an output buffer amplifier 109, and an analog/digital (A/D) converter 110. The sensor substrate 112 is a sensor in which pixels 100, which detect radiation, are arranged in a two-dimensional matrix. The sensor substrate 112 detects radiation and outputs image information.

FIG. 2 illustrates some of the pixels 100 provided on the sensor substrate 112 for the sake of simplified description, but an actual sensor substrate has more pixels. For example, for 17×17 inches, about 2800 rows×about 2800 columns of pixels are included. The pixels 100 are generally arranged in a two-dimensional matrix to form images used for diagnosis. Each of the pixels 100 has a conversion element 102 that converts radiation or light into an electric charge and a switch element 101 that outputs an electric signal in accordance with the electric charge of the conversion element 102.

The conversion element 102 is an indirect-type conversion element or a direct-type conversion element, and converts the applied radiation into an electric charge. The indirect-type conversion element has a wavelength converter that converts radiation into light and a photoelectric conversion element that converts the light into an electric charge. In the present example embodiment, as the indirect-type conversion element, a PIN-type photodiode containing amorphous silicon as the main ingredient is used. Alternatively, the direct-type conversion element that converts radiation directly into an electric charge may be used.

The switch element 101 can be a transistor having a control electrode and two main electrodes. In the present example embodiment, a thin-film transistor is used. Each conversion element 102 has one electrode electrically connected to one of the two main electrodes of the switch element 101 and the other electrode electrically connected to the bias source 103 via a common bias line Bs extending in the column direction.

In the 0th row, the control electrodes of the switch elements 101 of the pixels in the even-numbered columns (0th, 2rd, 4th, . . . columns) are electrically connected in common to a drive line Vg(0) and those in the odd-numbered columns (1st, 3rd, 5th, . . . columns) are electrically connected in common to a drive line Vg(1). The drive lines Vg(0) and Vg(1) extend in the row direction. Similarly, for the subsequent rows, the control electrodes of the switch elements 101 of the pixels in the odd-numbered columns in a k-th (k=0, 1, 2, . . . ) row are electrically connected in common to a drive line Vg(2K) and those in even-numbered columns in the k-th row are electrically connected in common to a drive line Vg(2k+1). One signal line Sig extending in the column direction is shared between two adjacent pixels.

That is, the switch elements 101 of the pixels in the 2k-th column and the 2k+1-th columns each have one main electrode connected to the conversion element and the other main electrode connected in common to the signal line Sig(k). The two drive lines Vg provided for each row are connected to the control electrodes of the switch elements 101 in the group of even-numbered columns or odd-numbered columns in each row to drive the switch elements 101 in the group corresponding to the respective drive lines Vg.

The drive circuit 114 is, for example, a shift register that supplies a drive signal to the switch elements 101 via the drive lines Vg(0), Vg(1), . . . , thus controlling a conductive state of the switch elements 101.

Under the control of the drive circuit 114, if a conducting voltage is applied to the drive line Vg(2k) and a non-conducting voltage is applied to the drive line Vg(2k+1), signals accumulated in the pixels of the even-numbered columns are output to the signal lines Sig(k). If the non-conducting voltage is applied to the drive line Vg(2k) and the conducting voltage is applied to the drive line Vg(2k+1), signals accumulated in the pixels of the odd-numbered columns are output to the signal lines Sig(k).

If the radiation amount is not uniform in the effective area of the sensor substrate such as when an intense radiation is incident on a portion of the sensor substrate, crosstalk may occur. Crosstalk occurring in parallel to the drive lines Vg (horizontal crosstalk) is problematic in particular at the time of high-speed driving of a moving image sensor. The horizontal crosstalk occurs due to instantaneous and local variation in the bias voltage. To address this, it is effective to reduce the variation in the bias voltage by providing a plurality of systems of the bias lines in the sensor substrate to decrease the wiring capacitance of the bias line.

Thus, in the present example embodiment, for bias lines Bs, two systems with different bias sources 103 are provided. A bias line Bs1 is supplied with a bias voltage from a first bias source 103-1 and is connected to the 0th, 1st, 4th, and 5th columns of the pixel array. A bias line Bs2 is supplied with a bias voltage from a second bias source 103-2 and is connected to the 2nd, 3rd, 6th, and 7th columns of the pixel array.

In the readout circuit 113, an amplifier circuit 106 which amplifies the electrical signal of the corresponding signal line is provided for each signal lines Sig(k). Each of the amplifier circuits 106 has an integration amplifier 105, a variable gain amplifier 104, and a sample-and-hold circuit 107.

The integration amplifier 105 amplifies electrical signals in the signal lines Sig(k). The variable gain amplifier 104 amplifies the electrical signals from the integration amplifier 105 based on a variable gain. The sample-and-hold circuit 107 samples and holds the electrical signals amplified by the variable gain amplifier 104.

The integration amplifier 105 has an operation amplifier 121 that amplifies and outputs electrical signals in the signal lines Sig(k), an integral capacitance 122, and a reset switch 123. The integration amplifier 105 can change a gain (amplification factor) by altering the value of the integral capacitance 122. The readout circuit 113 has a switch 126 for each column and a multiplexer 108. The multiplexer 108 sequentially brings the individual switch 126 in the respective columns into a conductive state to sequentially output, as serial signals, an electrical signal in parallel from the amplifier circuits 106 to the output buffer amplifier 109.

The output buffer amplifier 109 performs impedance conversion on the electrical signals and outputs the converted electrical signals. The A/D converter 110 converts the analog electrical signals output from the output buffer amplifier 109 into digital electrical signals and outputs the digital electrical signals as image information to the control computer 13 illustrated in FIG. 1.

The drive circuit 114 outputs a drive signal having a conducting voltage which brings the switch elements 101 into a conductive state and a non-conducting voltage which brings the switch elements 101 into a non-conductive state, to the drive lines Vg(0), Vg(1) . . . in accordance with control signals D-CLK, OE, and DIO from the drive control unit. Thus, the drive circuit 114 controls the conductive states and non-conductive states of the switch elements 101 to drive the sensor substrate 112.

The power supply unit 23 transforms electric power from a battery or an external power source, and supplies the electric power to the reference power source 111 in the amplifier circuit 106 and the bias sources 103, illustrated in FIG. 2. The reference power source 111 supplies a reference voltage Vref to non-inversion input terminals of the operation amplifiers 121. The bias sources 103 supply a bias voltage Vs_ref to the conversion elements via the bias lines Bs, and outputs current information including a temporal variation in the amount of electric current supplied to the bias lines Bs.

Each of the bias sources 103 can have a current-voltage conversion circuit 115 having an operation amplifier as illustrated in FIG. 2, as an example of a circuit that outputs current information. However, the circuit that outputs the current information is not limited to this configuration. For example, a current-voltage conversion circuit with a shunt resistance may be used instead. The output voltage of the current-voltage conversion circuit may be output as a digital value using an A/D conversion circuit for digital value conversion. Further alternatively, the physical amount corresponding to the amount of current supplied to the respective bias lines Bs may be output.

Figure 3:
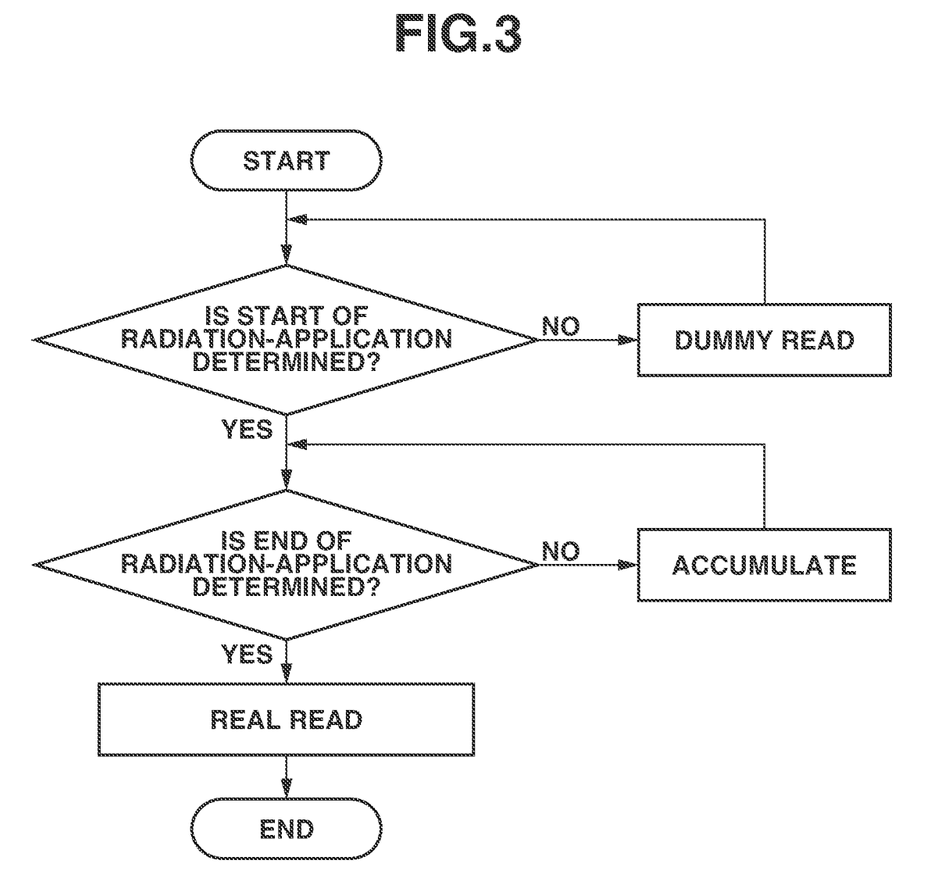
FIG. 3 is a flowchart illustrating operations of the radiation imaging apparatus according to the first example embodiment.

FIG. 3 is a flowchart illustrating operations of the radiation imaging apparatus 10. The drive control unit 25 makes a radiation-application start determination for determining whether application of radiation is started using the radiation information output by the calculation unit. As a method for the radiation-application start determination, a method is suitably used in which whether or not the application of radiation is started is determined in a case where the radiation intensity exceeds a predetermined threshold. In a case where it is determined that the application of radiation is not started (NO), the drive control unit 25 repeats a drive for eliminating the electric charge generated by accumulation of dark current (hereinafter, called dummy read). The dummy read is performed in order from the first row (0th row) to the last row (Y−1-th row), and when the dummy read is performed on the last raw, a return is made to the first row.

In a case where the drive control unit 25 determines that the application of radiation is started (YES), the drive control unit 25 makes a radiation-application end determination for determining whether the application of radiation is ended. As a method for radiation-application end determination, a method is suitably used in which whether or not the application of radiation is ended is determined in a case where a predetermined period of time has elapsed since the radiation-application start determination is made. The drive control unit 25 may determine that the application of radiation is ended in a case where the radiation intensity falls below a predetermined threshold.

If the drive control unit 25 determines that the application of radiation is not ended (NO), the drive control unit 25 repeats a drive for bringing the switches of all the pixels into the non-conductive state to accumulate signals resulting from radiation (hereinafter, called accumulation). If the drive control unit 25 determines that the application of radiation is ended (YES), the drive control unit 25 performs a drive for reading the electric charge generated by the accumulation of the radiation (hereinafter, called real read). The real read is performed in order from the first row to the last row, and when the real read is performed on the last raw, the series of imaging operations is ended.

Figure 4:
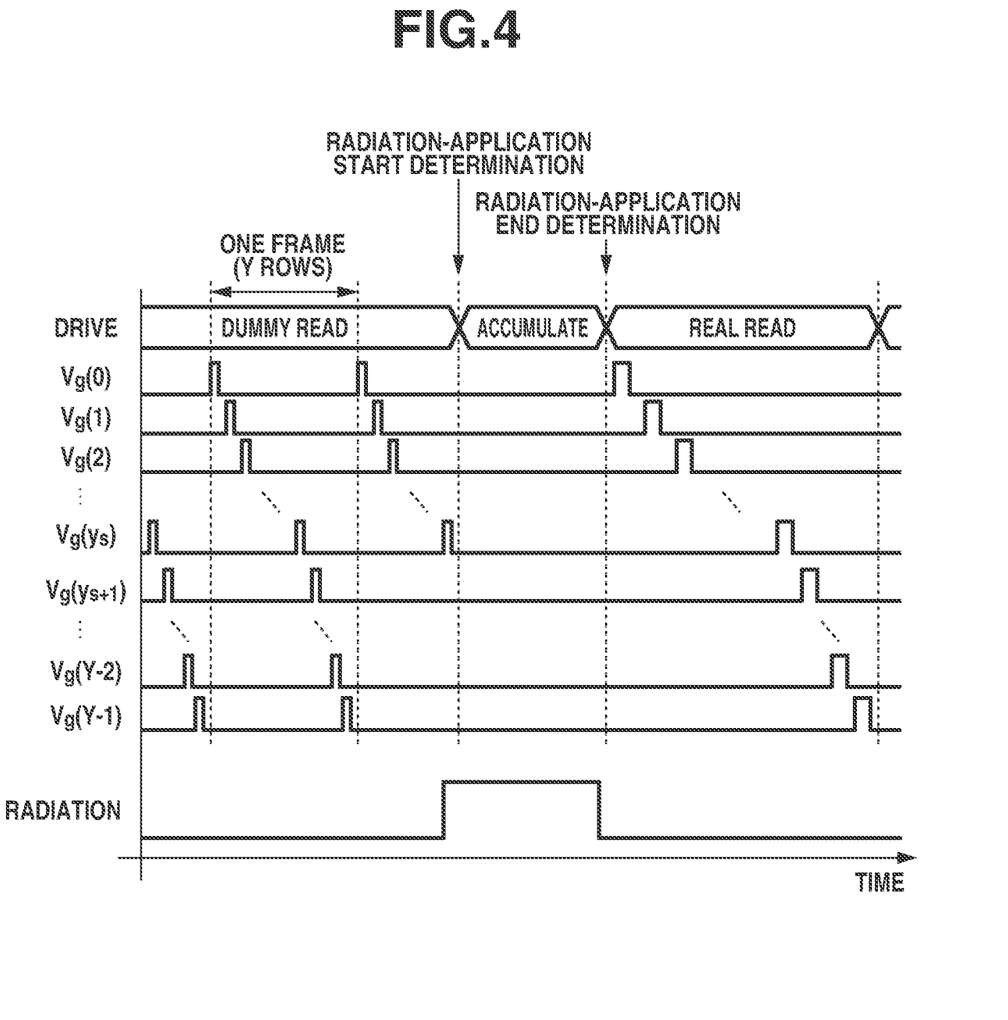
FIG. 4 is a timing chart illustrating the operations of the radiation imaging apparatus according to the first example embodiment.

FIG. 4 is a timing chart illustrating the operations of the radiation imaging apparatus 10. The drive control unit 25 repeats a drive for bringing, in series, the switch elements 101 into the conductive state in order from the first row (0th row) to the last row (Y−1-th row), that is, dummy read, until the drive control unit 25 determines that the application of radiation is started.

In a case where the dummy read has been performed on the last row, a return to the first row is made, and the dummy read is continued.

In a case where the drive control unit 25 determines that the application of radiation is started, the drive control unit 25 performs the drive for bringing the switch elements 101 in all the rows into the non-conductive state, that is, a shift to the accumulation is made. Further, the drive control unit 25 repeats the accumulation until the drive control unit 25 determines that the application of radiation is ended. The rows for which it has been determined that the application of radiation is started are designated as Ys. In a case where the drive control unit 25 determines that the application of radiation is ended, the drive control unit 25 performs the drive for bringing the switch elements 101 into the conductive state from the first row to the last row in sequence to read the signals and convert the signals into A/D conversion, that is, performs real read.

Figure 5:
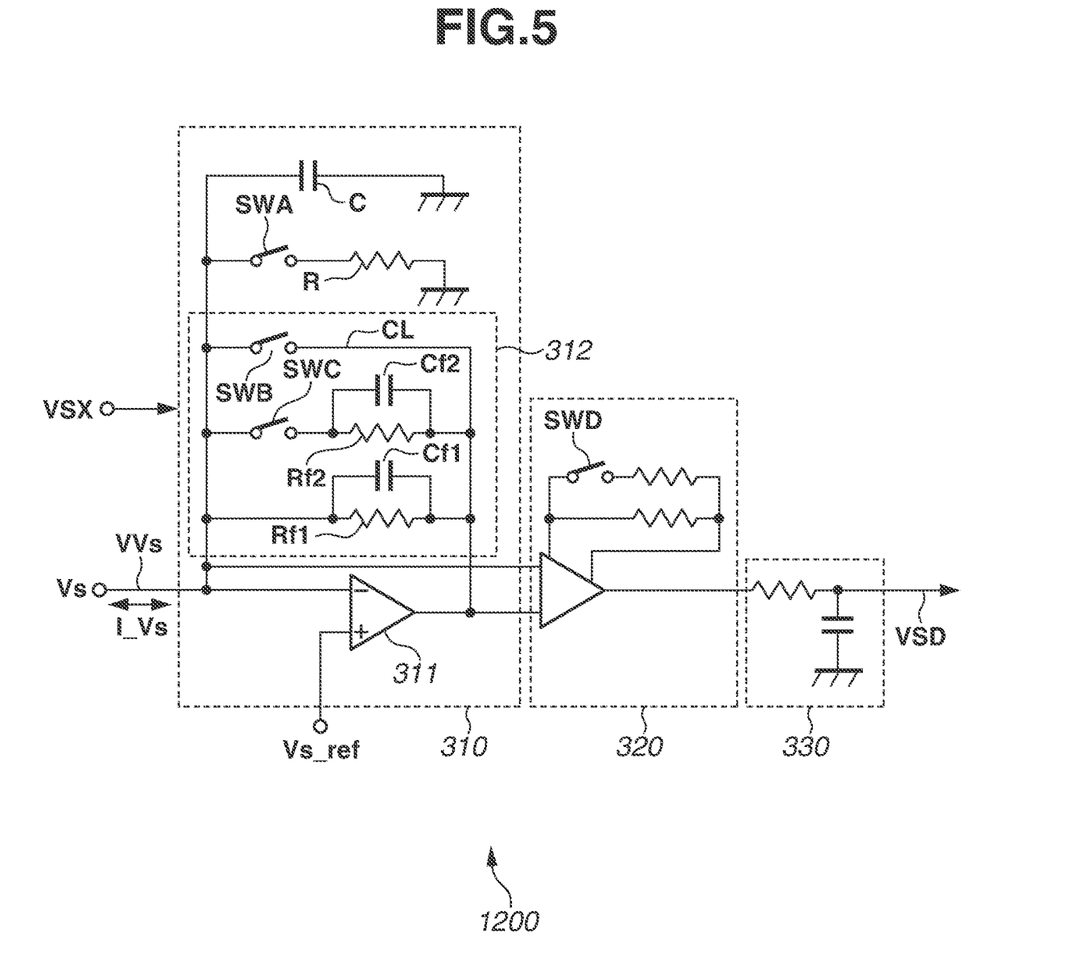
FIG. 5 is a diagram illustrating a configuration example of a current-voltage conversion circuit according to the first example embodiment.

FIG. 5 illustrates a configuration example of a detection circuit 1200 that is applicable as the current-voltage conversion circuit 115. The detection circuit 1200 detects a current flowing through the respective bias lines Bs and provides a bias current signal VSD indicating the current to the analog signal acquisition unit 24. The detection circuit 1200 can include a current-voltage conversion amplifier 310, a voltage amplifier 320, and a filter circuit 330. The current-voltage conversion amplifier 310 converts the current flowing through the respective bias lines Bs into a voltage.

The voltage amplifier 320 amplifies a signal (voltage signal) output from the current-voltage conversion amplifier 310. The voltage amplifier 320 can include an instrumentation amplifier. The filter circuit 330 is a filter that limits the frequency band of the signal output from the voltage amplifier 320, and can be a low-pass filter, for example. The current information having passed through the low-pass filter is supplied to the analog signal acquisition unit 24.

The current-voltage conversion amplifier 310 detects the current flowing through the respective bias lines Bs and supplies a potential in accordance with the reference bias potential Vs_ref provided by the power supply unit to the bias line Bs.

The current-voltage conversion amplifier 310 can be a transimpedance amplifier. The current-voltage conversion amplifier 310 includes, for example, an operation amplifier 311 and a feedback path 312 arranged between an inversion input terminal (second input terminal) and an output terminal of the operation amplifier 311. The reference bias potential Vs_ref is provided to a non-inversion input terminal (first input terminal) of the operation amplifier 311.

With the feedback path 312, the current-voltage conversion amplifier 310 functions to generate, at the inversion input terminal (second input terminal), a potential in accordance with the reference bias potential Vs_ref provided to the non-inversion input terminal (first input terminal) of the operation amplifier 311. More specifically, the current-voltage conversion amplifier 310 functions so as to generate, at the inversion input terminal, almost the same potential as the reference bias potential Vs_ref provided to the non-inversion input terminal of a differential amplifier circuit 211.

As illustrated in FIG. 5, a plurality of paths may be arranged in advance in the feedback path 312 so that the path to be enabled is switchable by switches SWA, SWB, SWC, and the like. The drive control unit may supply a control signal VSX to the detection circuit 1200, thus selecting the path to be enabled among the plurality of paths to control the impedance of the feedback path 312 of the current-voltage conversion amplifier 310 (hereinafter, feedback impedance).

Alternatively, as described below, the feedback impedance may be controlled in accordance with the drive state of the radiation imaging apparatus 10. For example, in order to swiftly detect the start of application of radiation for the sensor substrate 112 during the dummy read drive, the current flowing through the respective bias lines Bs is to be detected with high sensitivity. Thus, it is desirable that the feedback impedance (the gain of the current-voltage conversion amplifier 310) be increased during the dummy read drive.

If the feedback impedance is high at the time of transfer of the electric charges accumulated in the conversion elements 102 to the signal lines Sig during the real read drive, the supply of current from the bias lines Bs to the conversion elements 102 becomes slow. In particular, in a case where an intense radiation is incident on a part of the sensor substrate 112, an artifact (crosstalk) is likely to occur in an image due to the delay in the supply of current from the bias lines Bs to the conversion elements 102. Thus, it is desirable that the feedback impedance be decreased during the real read drive.

Figure 6A:
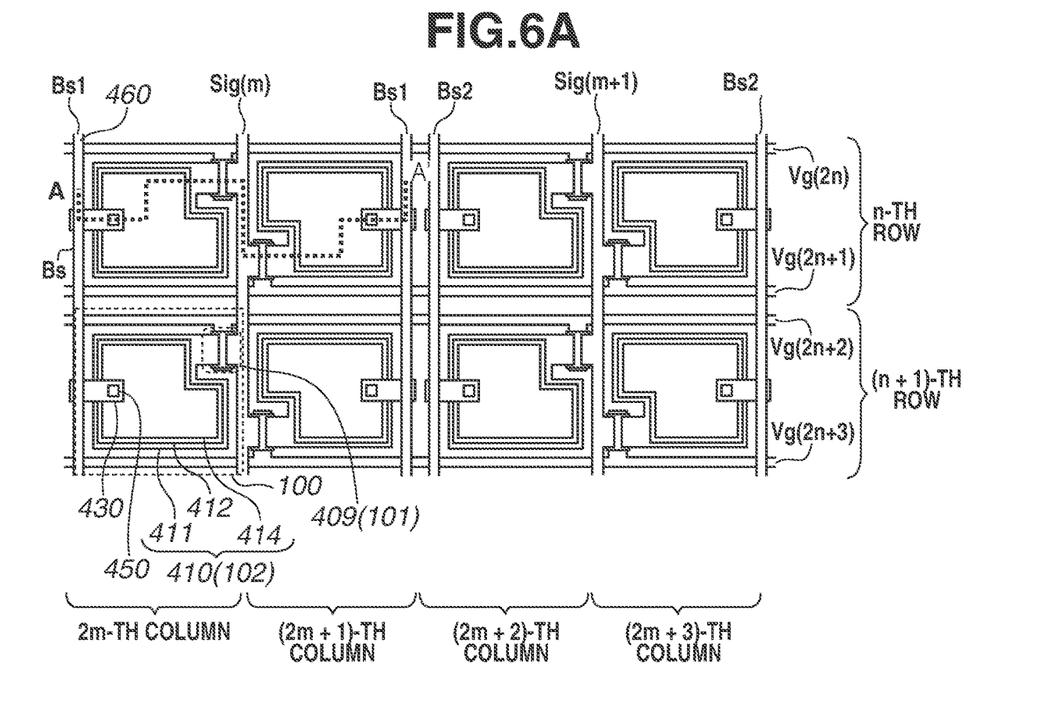
FIGS. 6A and 6B are a plan view and a cross-sectional view of pixels, respectively, according to the first example embodiment.

Next, a structure of the pixels 100 will be described with reference to FIGS. 6A and 6B. FIG. 6A is a plan view of the pixels 100, and FIG. 6B is a cross-sectional view taken along A-A' of FIG. 6A.

Figure 6B:
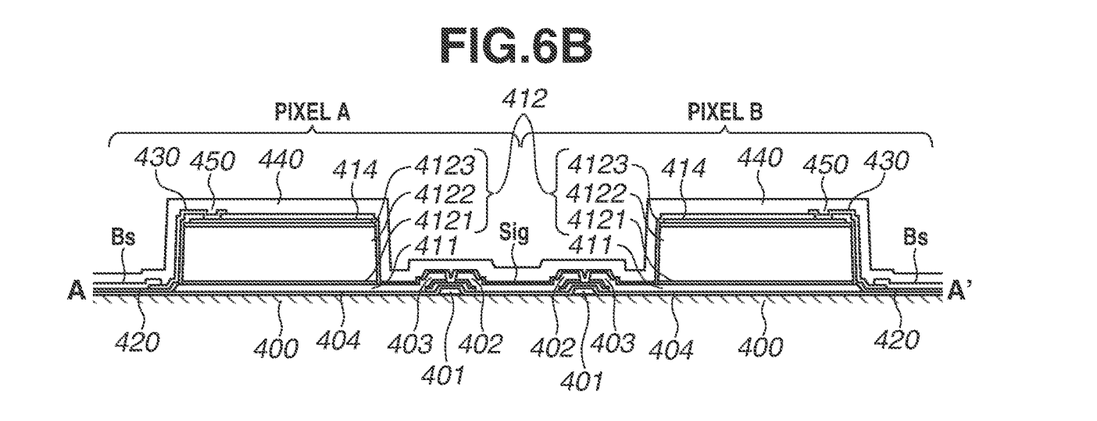

In FIGS. 6A and 6B, a substrate 400 is, for example, an insulating substrate of glass or plastic. A thin-film transistor 409 is formed on the substrate 400 and includes a control electrode 401, a first main electrode 402, a second main electrode 403, and an insulating layer 404. The control electrode 401 and a drive line Vg, and the first main electrode 402 and a signal line Sig, are integrally formed with respective common metal films. The insulating layer 404 functions as a gate insulating film of the thin-film transistor 409. The thin-film transistor 409 may have a light-shielding layer (not illustrated).

In other words, the thin-film transistor according to the present example embodiment is provided on the insulating substrate and has the control electrode, the insulating layer provided on the control electrode, and the first main electrode and the second main electrode provided on the insulating layer.

A PIN-type photodiode 410 is formed by laminating a first electrode 411, a semiconductor layer 412, and a second electrode 414 in this order. Among these components, the semiconductor layer 412 is formed by laminating a first impurity semiconductor layer 4121, an intrinsic semiconductor layer 4122, and a second impurity semiconductor layer 4123 in this order. In the present example embodiment, the second main electrode 403 of the thin-film transistor 409 and the first electrode 411 of the conversion element are integrally formed with a common metal film, but may be formed with different conductive materials. That is, the conversion element (PIN-type photodiode) according to the present example embodiment is provided on the thin-film transistor.

The thin-film transistor 409 and the PIN-type photodiode 410 are covered by a common insulating layer 420, except for an opening 450 in a portion of the second electrode 414 of the PIN-type photodiode 410. The bias lines Bs are provided on the insulating layer 420. A conductive layer 430 electrically connects the respective bias lines Bs and the respective second electrodes 414 with the corresponding opening 450 serving as a contact hole.

The bias lines Bs can be formed with a metal film, and the conductive layer 430 can be formed with a transparent conductive film of indium tin oxide (ITO) or the like. A final protective layer 440 covers the above-described entire structure. The insulating layers 404 and 420 and the final protective layer 440 can be formed with an inorganic insulating film of silicon nitride or the like. A scintillator (not illustrated) is provided to face the above-described structure.

This configuration results in two orientations in the arrangement of the pixels 100 with respect to the signal lines Sig. Referring to FIG. 6B, the pixel 100 in which the thin-film transistor 409 serving as the switch element 101 of the pixel 100 is connected to the corresponding signal line Sig from the left side will be hereinafter called pixel A. The pixel 100 in which the thin-film transistor 409 serving as the switch element 101 of the pixel 100 is connected to the corresponding signal line Sig from the right side will be called pixel B.

In such connections, consideration is given to a case where the signal line layer may be shifted to the left side in FIGS. 6A and 6B due to misalignment of the signal line layer at the time of exposure. Accordingly, in the pixel A, an area in which the first main electrode 402 and the control electrode 401 overlap increases, resulting in an increase of coupling capacitance (hereinafter, called Ca) between the first main electrode 402 and the control electrode 401.

In the pixel B, an area in which the second main electrode 403 and the control electrode 401 overlap increases, resulting in an increase of coupling capacitance (hereinafter, called Cb) between the second main electrode 403 and the control electrode 401.

The capacitance Ca does not affect the wiring capacitance of the bias line Bs. However, the capacitance Cb is in capacitive-coupled with the bias line Bs via the first electrode 411 of the PIN-type photodiode 410. Thus, the wiring capacitance of the bias line Bs increases in the pixel B in which Cb increases, and the wiring capacitance of the bias line Bs decreases in the pixel A in which Cb decreases. Thus, the pixel A and the pixel B have different influences on the wiring capacitance of the respective bias lines Bs.

In FIG. 6A, the first bias line Bs1 is connected to the electrodes of the conversion elements 102 in the pixels A in the first column from the left and the pixels B in the second column from the left. Similarly, the second bias line Bs2 is connected to the electrodes of the conversion elements 102 in the pixels A in the third column from the left and the pixels B in the fourth column from the left.

That is, connected to the Sig(m) (the first signal line) are the thin-film transistors 409 of the pixels (the first pixels) arranged in the 2m-th column from the left side as seen in the row direction in FIG. 6A and the thin-film transistors 49 of the pixels (the second pixels) arranged on the (2m+1)-th column from the opposite side.

Similarly, connected to the Sig(m+1) (the second signal line) are the thin-film transistors 409 of the pixels (the third pixels) arranged in the (2m+2)-th column from the left side and the thin-film transistors 409 of the pixels (the fourth pixels) arranged in the (2m+2)-th column from the opposite side. Connected to the first bias line Bs1 are the conversion elements 102 of the first pixels and the conversion elements 102 of the second pixels, and connected to the second bias line Bs2 are the conversion elements 102 of the third pixels and the conversion elements 102 of the fourth pixels.

In such connections, two pixels A and two pixels B are connected to the bias line Bs1, and two pixels A and two pixels B are connected to the bias line Bs2.

As described above, interchanging of the systems of the bias lines connected to every two adjacent columns of pixels equalizes the pixels A and the pixels B in number in each bias line, thus cancelling out a parasitic capacitance caused by a misalignment as described above.

The numbers of the pixels A and pixels B are ideally equal in each system of bias line, but they may not be exactly the same, for example, due to conditions on the number of columns of pixels. In such a case as well, the beneficial effect of cancelling out a difference in parasitic capacitance and reducing artifacts can be expected by connecting the pixels A and the pixels B to each system of the bias lines according to the configuration.

The beneficial effect of reducing a difference in parasitic capacitance between the bias lines can be expected only by connecting both the pixels A and the pixels B to one bias line Bs, as compared with the case where the pixels A and the pixels B are connected in an unbalanced manner to one of the two systems of the bias lines Bs.

According to the present example embodiment, in a case where a plurality of systems of the bias lines is arranged in a structure where a signal line is shared between adjacent columns of pixels, the same numbers of pixels A and pixels B can be connected to each of the bias lines. Equalizing the numbers of pixels A and pixels B in each system of the bias lines makes it possible to cancel out a difference in parasitic capacitance between the bias lines caused by a misalignment of the signal line layers and reduce artifacts resulting from the wiring capacitances of the bias lines.

Figure 7:
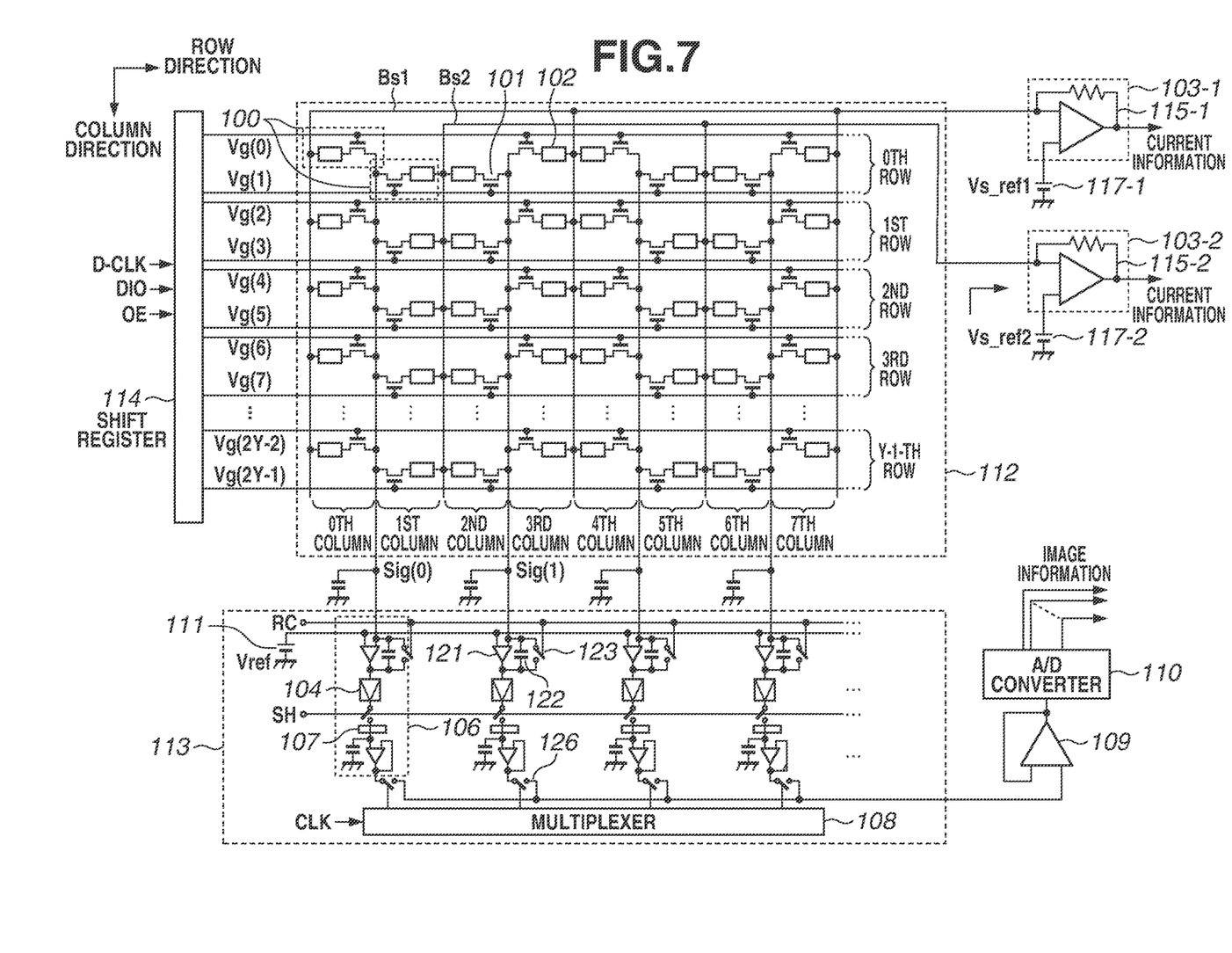
FIG. 7 is an equivalent circuit in a radiation imaging apparatus according to a second example embodiment.

Next, a second example embodiment of the present disclosure will be described. FIG. 7 illustrates a portion of an equivalent circuit in an imaging apparatus in the second example embodiment. The difference from the first example embodiment is in layout of a bias line Bs1, a bias line Bs2, and pixels.

Pixels in 0th, 3rd, 4th, and 7th columns are connected to drive lines Vg in even-numbered rows, and pixels in 1st, 2nd, 5th, and 6th columns are connected to drive lines Vg in odd-numbered rows.

The pixels in 0th, 3rd, 4th, and 7th columns are connected to the bias line Bs1, and the pixels in 1st, 2nd, 5th, and 6th columns are connected to the bias line Bs2.

That is, connected to Sig(0) (first signal line) are thin-film transistors 409 of the pixels (first pixels) arranged in the 0th column from the left side in a row direction of FIG. 7 and thin-film transistors 409 of the pixels (second pixels) arranged in a (2m+1)-th column from the opposite side.

Similarly, connected to Sig(m+1) (second signal line) are thin-film transistors 409 of the pixels (third pixels) arranged in a (2m+2)-th column from the left side and thin-film transistors 409 of the pixels (fourth pixels) arranged in a (2m+2)-th column from the opposite side. The conversion elements 102 of the first pixels and the conversion elements 102 of the fourth pixel are connected to the first bias line Bs1, and the conversion elements 102 of the second pixels and the conversion elements 102 of the third pixels are connected to the second bias line Bs2.

As in the first example embodiment, the number of the pixel A and pixels B connected to the bias line Bs1 and the number of the pixels A and pixels B connected to the bias line Bs2 are the same. Thus, this configuration also enables canceling out of a capacitance change in the bias lines caused by a misalignment of the signal line layer.

In addition, in the configuration of FIG. 7, information about the current flowing through the bias line Bs1 and the bias line Bs2 can be individually sampled. For example, when an ON voltage is applied to the drive lines in the even-numbered rows, the switch elements 101 of the pixels in the 0th, 3rd, 4th, and 7th columns become conductive, and current flows through the bias line Bs1. At this time, the switch elements 101 of the pixels in the 1st, 2nd, 5th, and 6th columns connected to the bias line Bs2 are in the non-conductive state and thus no current flows into the bias line Bs2.

Figure 8:
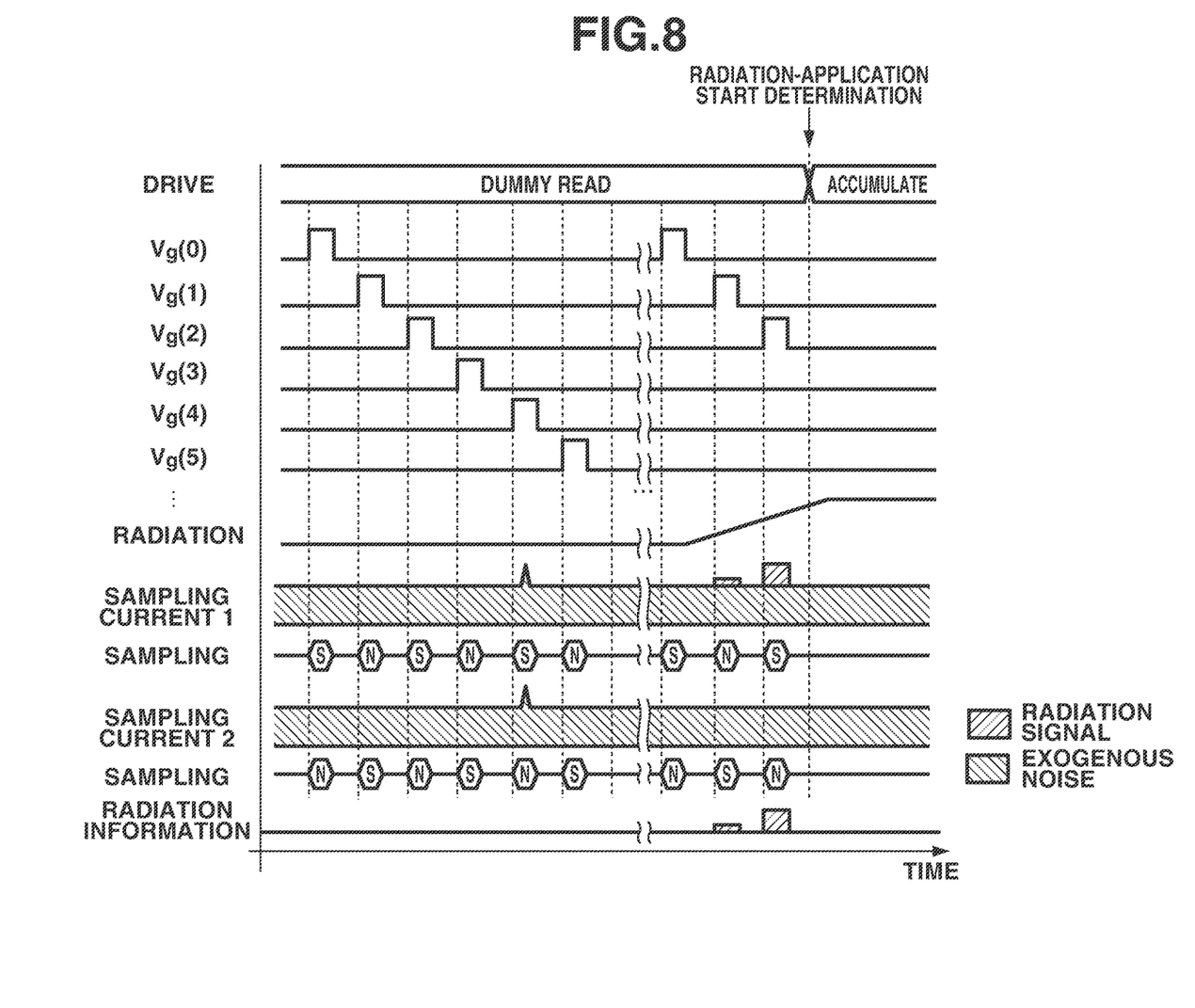
FIG. 8 is a timing chart in a case where correlated double sampling drive according to the second example embodiment is performed.

FIG. 8 illustrates an example of a timing chart with execution of correlated double sampling (CDS) drive in the analog signal acquisition unit according to the present example embodiment. If a conducting voltage is applied to the drive line Vg(0) is and a non-conducting voltage is applied to the other drive lines Vg, the switch elements 101 of the pixels in the 0th, 3rd, 4th, and 7th columns in the 0th row become conductive with the respective signal lines. At this time, if radiation is applied, a first bias current (I1) based on the photoelectric conversion flows into a bias source 103-1 (Vs1).

The switch elements 101 of the pixels 100 connected to a bias source 103-2 are not conductive and thus the first bias current I1 does not flow thereinto. Thus, it is possible to remove a noise component and acquire the current information by concurrently sampling the first bias current, which is the current of the bias source 103-1, and a second bias current, which is the current of the bias source 103-2, and then performing an arithmetic operation of the both bias currents as S and N, respectively.

In FIG. 7, as illustrated by a portion during which a conducting voltage is being applied to a drive line Vg(4), even in a case where, for example, an exogenous noise varies with time, performing an arithmetic operation for variation amounts S and N (such as S-N) makes it possible to remove an exogenous noise component and acquire current values with accuracy.

According to the configuration of the present example embodiment, it is possible to unify the capacitances between the bias line Bs1 and the bias line Bs2 and detects the start of the application of radiation with accuracy.

The above-mentioned measure provides an advantageous technology in reducing artifacts of radiation images while preventing or reducing an increase in the cost of members.

While example embodiments have been described, it is to be understood that the present invention is not limited to the disclosed example embodiments. The scope of the following claims is to be accorded the broadest interpretation so as to encompass all such modifications and equivalent structures and functions.

This application claims the benefit of Japanese Patent Application No. 2020-214013, filed Dec. 23, 2020, which is hereby incorporated by reference herein in its entirety.

What is claimed is:

1. A radiation imaging apparatus comprising:
a plurality of pixels each of which has a thin-film transistor and a conversion element and is arranged in a two-dimensional matrix; and
a plurality of signal lines that is connected to a plurality of the thin-film transistors arranged in a column direction,
wherein the plurality of pixels includes a first pixel arranged in a first column, a second pixel arranged in a second column adjacent to the first pixel in a row direction, a third pixel arranged in a third column adjacent to the second pixel on an opposite side adjacent to the first pixel in the row direction, and a fourth pixel arranged in a fourth column adjacent to the third pixel on an opposite side adjacent to the second pixel in the row direction,
wherein the plurality of signal lines includes at least a first signal line and a second signal line arranged adjacent to the first signal line in the row direction,
wherein the thin-film transistor of the first pixel is connected to the first signal line from a first direction out of the row direction, and the thin-film transistor of the second pixel is connected to the first signal line from a second direction opposite to the first direction,
wherein the thin-film transistor of the third pixel is connected to the second signal line from the first direction, and the thin-film transistor of the fourth pixel is connected to the second signal line from the second direction,
wherein the radiation imaging apparatus further comprises:
a first bias line for supplying a bias voltage from a first bias source to a plurality of the conversion elements arranged in the column direction;
a second bias line for supplying a bias voltage from a second bias source different from the first bias source to the plurality of conversion elements arranged in the column direction,
wherein the first bias line is connected to the conversion element of the first pixel and the conversion element of the second pixel, and the second bias line is connected to the conversion element of the third pixel and the conversion element of the fourth pixel, or
wherein the first bias line is connected to the conversion element of the first pixel and the conversion element of the fourth pixel, and the second bias line is connected to the conversion element of the third pixel and the conversion element of the second pixel.

2. The radiation imaging apparatus according to claim 1, wherein the number of the conversion elements connected to the first bias line from the first direction and the number of the conversion elements connected to the second bias line from the first direction are the same, and the number of the conversion elements connected to the first bias line from the second direction and the number of the conversion elements connected to the second bias line from the second direction are the same.

3. The radiation imaging apparatus according to claim 1, wherein the first bias line is connected to the conversion element of the first pixel and the conversion element of the second pixel, and the second bias line is connected to the conversion element of the third pixel and the conversion element of the fourth pixel.

4. The radiation imaging apparatus according to claim 1, wherein the first bias line is connected to the conversion element of the first pixel and the conversion element of the fourth pixel, and the second bias line is connected to the conversion element of the third pixel and the conversion element of the second pixel.

5. The radiation imaging apparatus according to claim 1, wherein the thin-film transistor is disposed on an insulating substrate and has a control electrode, an insulating layer disposed on the control electrode, and a first main electrode and a second main electrode disposed on the insulating layer.

6. The radiation imaging apparatus according to claim 5, wherein the conversion element is disposed on the thin-film transistor.

7. The radiation imaging apparatus according to claim 1, further comprising an analog signal acquisition unit configured to acquire a first bias current flowing through the first bias source and a second bias current flowing through the second bias source,
wherein the analog signal acquisition unit detects that radiation has been applied to the plurality of pixels based on at least one of the first bias current and the second bias current.

8. The radiation imaging apparatus according to claim 7, further comprising a plurality of drive lines for performing a drive to read out an electric charge from the plurality of pixels arranged in the row direction,
wherein the first bias line is connected to, among the plurality of pixels, a pixel to be subjected to the drive using a first drive line among the plurality of drive lines,
wherein the second bias line is connected to, among the plurality of pixels, a pixel to be subjected to the drive using a second drive line different from the first drive line among the plurality of drive lines, and
wherein the analog signal acquisition unit performs the detection based on at least one of the first bias current and the second bias current.

9. The radiation imaging apparatus according to claim 8, wherein the analog signal acquisition unit performs correlated double sampling based on the first bias current and the second bias current.

10. The radiation imaging apparatus according to claim 1, further comprising a scintillator configured to convert the radiation into light on the plurality of pixels.

11. A radiation imaging system comprising:
a radiation imaging apparatus according to claim 1; and
a radiation generation apparatus configured to apply radiation to the radiation imaging apparatus.

* * * * *